United States Patent
Lee

(10) Patent No.: US 6,437,618 B2
(45) Date of Patent: Aug. 20, 2002

(54) DELAY LOCKED LOOP INCORPORATING A RING TYPE DELAY AND COUNTING ELEMENTS

(75) Inventor: Seong-Hoon Lee, Ichon-shi (KR)

(73) Assignee: Hyundai Electronics Industries Co., Ltd., Kyoungki-Do (KR)

(*) Notice: Subject to any disclaimer, the term of this patent is extended or adjusted under 35 U.S.C. 154(b) by 0 days.

(21) Appl. No.: 09/888,905

(22) Filed: Jun. 25, 2001

(30) Foreign Application Priority Data

Jun. 30, 2000 (KR) ........................................ 2000-36728

(51) Int. Cl.[7] ................................................ H03L 7/06
(52) U.S. Cl. ........................................ 327/158; 327/236
(58) Field of Search ................................... 327/156, 158, 327/261, 244, 236, 147, 149, 160, 151

(56) References Cited

U.S. PATENT DOCUMENTS 6,204,694 B1 * 3/2001 Sunter et al. ................. 326/93

* cited by examiner

*Primary Examiner*—Dinh T. Le
(74) *Attorney, Agent, or Firm*—Marshall, Gerstein & Borun

(57) ABSTRACT

Disclosed is a delay locked loop for use in a semiconductor memory device, for operating in low clock frequency applications that require a small chip size. The delay locked loop includes an input unit for receiving an external clock signal from which a clock input signal is created; a delay monitor for receiving a clock output signal to monitor a time delay introduced on the clock input signal; and a phase detection unit for receiving the clock input signal and an output of the delay monitor for determining a difference in phase between the clock input and output signals to produce a shift control signal. A shift register for controlling the adjustment of the time delay and a delay line for adjusting the time delay are also provided in the delay locked loop. Both the shift register and the delay line have a ring configuration on their outputs. The delay locked loop provided also includes a first and a second counter for counting the number of data signals outputted from the delay line and the shift register, respectively; a comparator for comparing these counted numbers; and an output unit for receiving the output of the delay line and the compared value to produce the clock output signal.

10 Claims, 5 Drawing Sheets

DELAY LOCKED LOOP INCORPORATING A RING TYPE DELAY AND COUNTING ELEMENTS

FIELD OF THE INVENTION

The present invention relates to a semiconductor memory device and, more particularly, to a delay locked loop having the ability to operate in low frequency applications.

BACKGROUND OF THE INVENTION

In general, a delay locked loop (DLL) circuit reduces the skew between a clock signal and a data signal or between an external clock and an internal clock. In this latter example, a DLL is used in synchronizing an internal clock of a synchronous memory to an external clock to avoid signal timing errors. Specifically, as a timing delay occurs when using an external clock with a system, the delay locked loop adjusts the timing delay to synchronize the internal clock of the system to the external clock.

FIG. 1 is a schematic block diagram of a conventional linear register controlled digital delay line (DDL). Specifically, a synchronous DRAM memory application having a delay locked loop 500 and other peripheral circuits is shown. The conventional delay locked loop 500 comprises an input unit 100, a delay monitor 110, a phase detection unit 120, a shift register 130, and a digital delay line 140.

The input unit 100 receives an external clock signal CLK and produces a delay lock loop clock input signal CLKin. The delay monitor 110 receives an output signal CLKout generated by the delay locked loop 500 to monitor any time delay between the clock input signal CLKin and the clock output signal CLKout. The phase detection unit 120 receives the clock input signal CLKin from the input unit 100 and the output signal from the delay monitor 110 and determines the difference in phase between these received signals. Based on the phase difference, the detection unit 120 produces a shift control signal. The shift control signal can be a left shift signal or a right shift signal. The shift register 130 controls the adjustment of the time delay, based on the shift control signal from the phase detection unit 120. The digital delay line 140 adjusts the time delay according to the output of the shift register 130.

In this example, data read by a DRAM core block 150 is synchronous with the clock output signal CLKout, and a synchronized signal is outputted through a D-flip flop 160 and an output driver unit 170. When the delay locked loop 500 is not in use, i.e., when the clock input signal CLKin and the clock output signal CLKout are synchronous in phase, the final output data DQ is skewed from the external clock signal, where the skew corresponds to a time delay $t_R$ introduced at the input unit 100 (as shown) plus a time delay $t_D$ introduced between the D-flip flop 160 and the output drive unit 170 (as shown). Accordingly, the use of the delay locked loop shown in FIG. 1 allows the final output data DQ to be synchronized with the external clock signal. To achieve this synchronization, the clock input signal CLKin is delayed by a certain time period.

FIG. 2 is a detailed block diagram of the conventional digital delay line 140 that is used to adjust the above-described delay. The digital delay line 140 includes a control unit 200 for outputting the clock input signal CLKin fed thereto from the input unit 100 based on three shift signals (s1, s2, s3), received from the shift register 130. The digital delay line 140 also includes a delay block 210 for performing a time delay on the clock input signal CLKin under the control of the control unit 200 and an output unit 220 for outputting a time-delayed signal from the delay block 210 as the clock output signal CLKout. Specifically, the control unit 200 includes a first NAND gate 201 with the clock input signal CLKin and the third shift signal s3 as its inputs, a second NAND gate 202 with the clock input signal CLKin and the second shift signal s2 as its inputs, and a third NAND gate 203 with the clock input signal CLKin and the first shift signal s1 as its inputs.

The delay block 210 includes a fourth NAND gate 204 with the output of the first NAND gate 201 and a line input voltage Vcc as its inputs; a fifth NAND gate 205 with the output of the fourth NAND gate 204 and the line input voltage Vcc as its inputs; a sixth NAND gate 206 with the output of the second NAND gate 202 and the output of the fifth NAND gate 205 as its inputs; a seventh NAND gate 207 with the output of the sixth NAND gate 206 and the line input voltage Vcc as its inputs; an eighth NAND gate 208 with the output of the third NAND gate 203 and the output of the seventh NAND gate 207 as its inputs, and a ninth NAND gate 209 with the output of the eighth NAND gate 208 and the line input voltage Vcc as its inputs. The output unit 220 includes a tenth NAND gate having the output of the ninth NAND gate 209 and the line input voltage Vcc as its inputs.

For the sake of brevity, in the delay block 210 shown in FIG. 2, only three stages (termed unit delays) have been drawn, each having two NAND gates serially connected. In practice, however one hundred or more unit delays may be required. For example, the number of the unit delays required increases for lower frequency clock signals. Of course, including a large number of unit delays increases the chip size required for the DLL.

In operation, initially when the first shift signal s1 is logic high, and the second and third shift signals s2 and s3 are logic low, the clock output signal CLKout is delayed from the clock input signal CLKin by one unit delay 230. In this case, a time delay between the control unit 200 with the clock input signal CLKin as its input and the NAND gate 220 can be compensated by including it in delay monitor like the time delay of clock receiver, D-flip flop and output driver.

The clock output signal CLKout is relayed to the delay monitor 110 (FIG. 1), which inputs a time-delayed signal to the phase detection unit 120. As mentioned above, the phase detection unit 120 compares the time-delayed signal and the clock input signal CLKin. If it is necessary to further delay the clock output signal CLKout, the phase detection unit 120 activates the left shift signal. Thus, the first shift signal s1 is rendered to logic low and the second shift signal s2 is rendered to logic high. That is, the logic high signal is moved one unit delay to the left. Hereafter, the CLKout signal will be delayed two unit delays. If it is necessary to still further delay the clock output signal CLKout, the phase detection unit 120 activates the left shift signal, to thereby allow the third shift signal s3 to be rendered logic high with the first and second shift signals being logic low. In this case, the clock output signal CLKout is delayed by three unit delays.

On the other hand, if the phase detection unit 120 determines that the delay of the clock output signal CLKout should be decreased, it activates the right shift signal to reduce the number of the unit delays used in delaying the clock input signal CLKin. The above procedure is repeatedly performed until the clock input signal CLKin and the clock output signal CLKout are synchronous in phase.

Since the number of the unit delays is proportional to a difference between one clock cycle, $t_{CK}$, and a compensation delay, $t_{DM}$, the number of unit delays increases as the clock frequency (i.e., the inverse of the clock cycle) gets lower. For example, when the unit delay is 0.1 nsec, and the $t_{CK}$ and the $t_{DM}$ are 15 nsec and 3 nsec, respectively, 120 unit delays are required.

As stated above, the conventional linear register-controlled DDL suffers from the disadvantage that since it employs a linear delay line, the number of unit delays required increases as clock frequency lowers, thereby resulting in large chip size. It is, therefore, desirable to provide a delay locked loop, for use in a semiconductor memory device, capable of operating in low frequency applications with a smaller chip size.

SUMMARY OF THE INVENTION

In accordance with an aspect of the invention, a delay locked loop is provided for use in a semiconductor memory device. The delay locked loop includes a delay line including a loop for re-circulating a received signal through at least a portion of the delay line. It also includes a control circuit for controlling a number of times that the received signal is re-circulated through the at least a portion of the delay line to achieve a desired delay.

BRIEF DESCRIPTION OF THE DRAWINGS

An exemplary apparatus will now be described with reference to the accompanying drawings, in which.

DETAILED DESCRIPTION OF THE PREFERRED EMBODIMENTS

Figure 3:
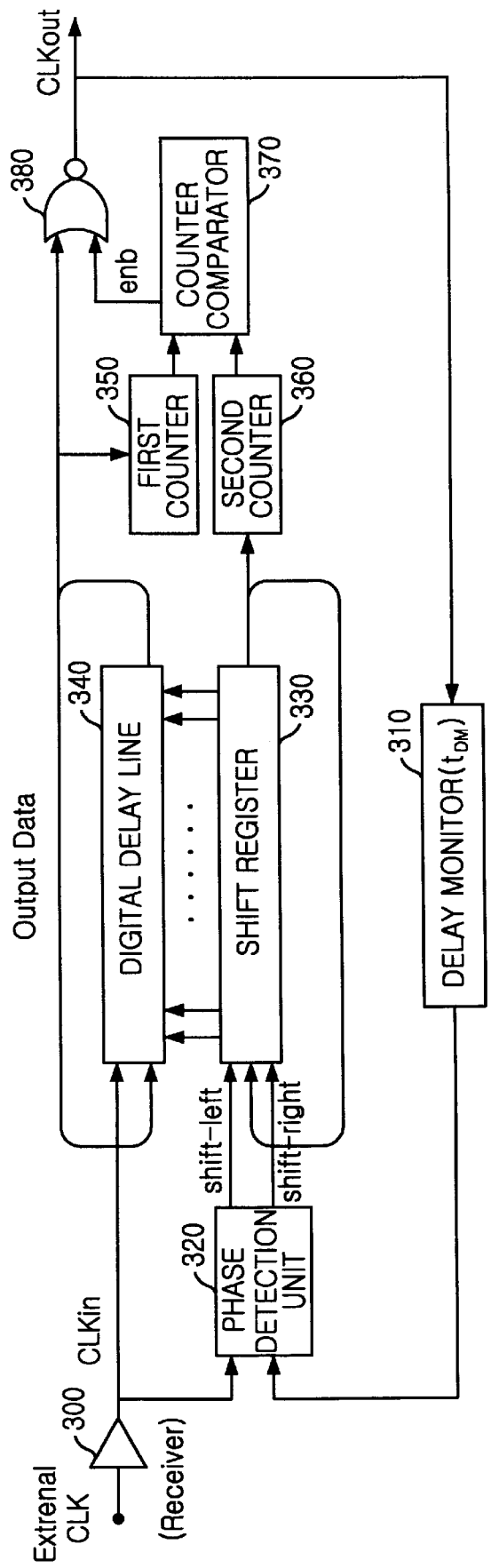
FIG. 3 is a schematic block diagram of an exemplary delay locked loop constructed in accordance with the teachings of the present invention.

There is shown in FIG. 3 a schematic block diagram of a delay locked loop 600. The delay locked loop 600 of FIG. 3 comprises an input unit 300, a delay monitor 310, a phase detection unit 320, a shift register 330, a digital delay line 340, a first and a second counter 350 and 360, a counter comparator 370 and an output unit 380. The input unit 300 receives an external clock signal to produce a clock input signal CLKin. The delay monitor 310 receives a final output signal CLKout generated from the delay locked loop 600 to monitor a time delay introduced on the clock input signal CLKin. The phase detection unit 320 receives the clock input signal CLKin from the input unit 300 and an output signal of the delay monitor 310 and determines the difference in phase between these received signals to produce a shift control signal (i.e., either a left shift signal or a right shift signal).

The shift register 330 controls the adjustment of the time delay between CLKin and CLKout in response to the shift control signal from the phase detection unit 320. Unlike the prior art, the output of the shift register 300 is feedback to its input via a loop forming a ring configuration. The digital delay line 340 adjusts the time delay based on the output of the shift register 330 and also has an output in a ring configuration.

The first counter 350 serves to count the number of times the clock signal is outputted from the digital delay line 340. The second counter 360 serves to count the number of times a logic high bit is circulated around the loop of the shift register 330. The counter comparator 370 compares a counted number from the first counter 350 and a counted number from the second counter 360 to produce the compared result, labeled enb, which is provided to the output unit 380. The output unit 380 receives the output data from the digital delay line 340 and the compared data from the counter comparator 370 to produce the clock output signal CLKout as the final output signal when the value of the first counter 350 equals the value of the second counter 360.

Figure 1:
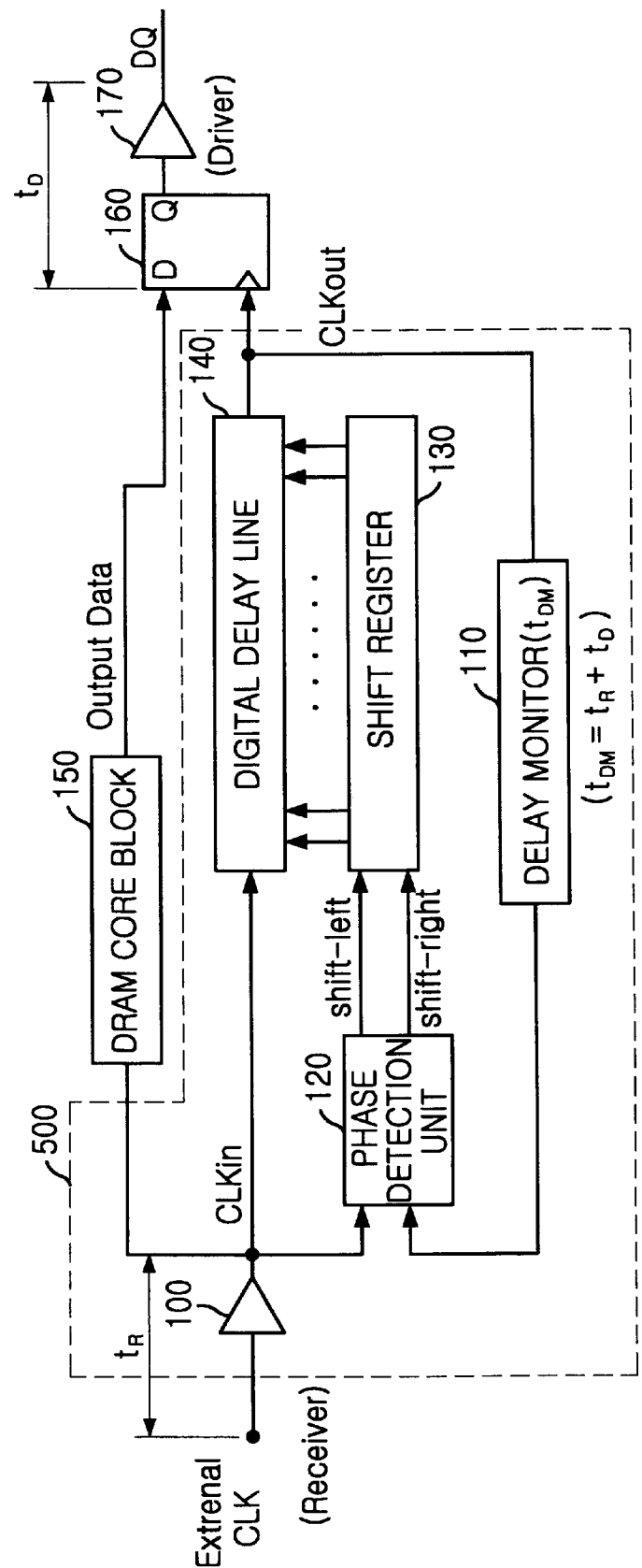
FIG. 1 is a schematic block diagram of a conventional delay locked loop DLL.
Figure 2:
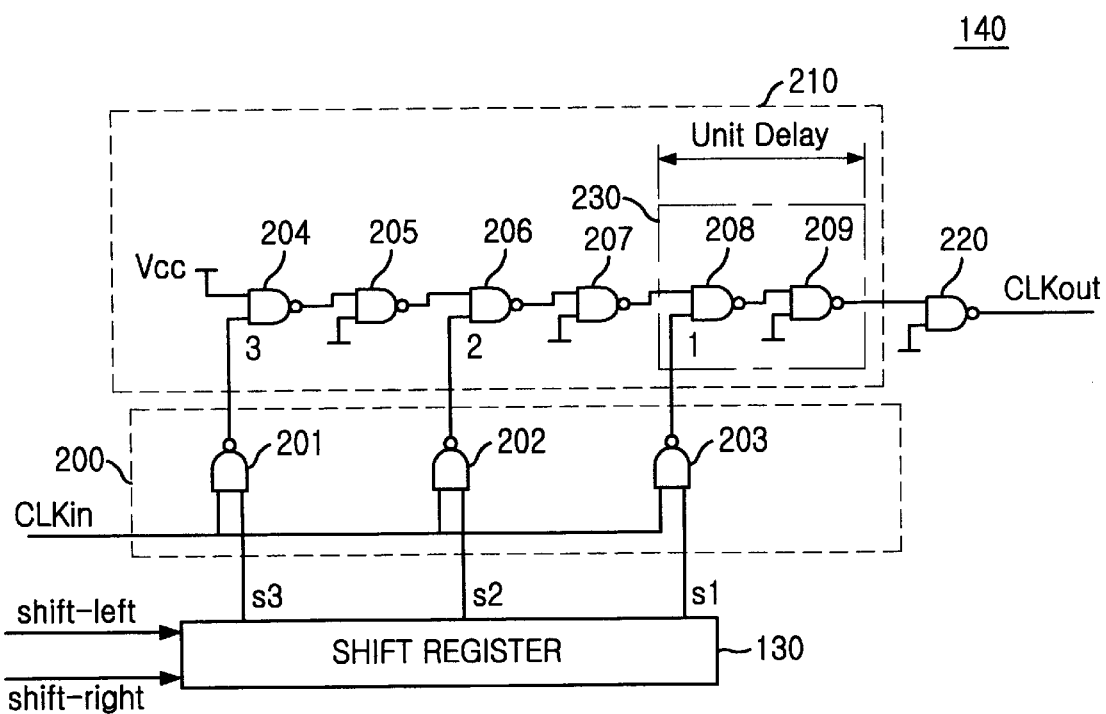
FIG. 2 is a logic level detailed block diagram of a conventional digital delay line having three-stages.
Figure 4:
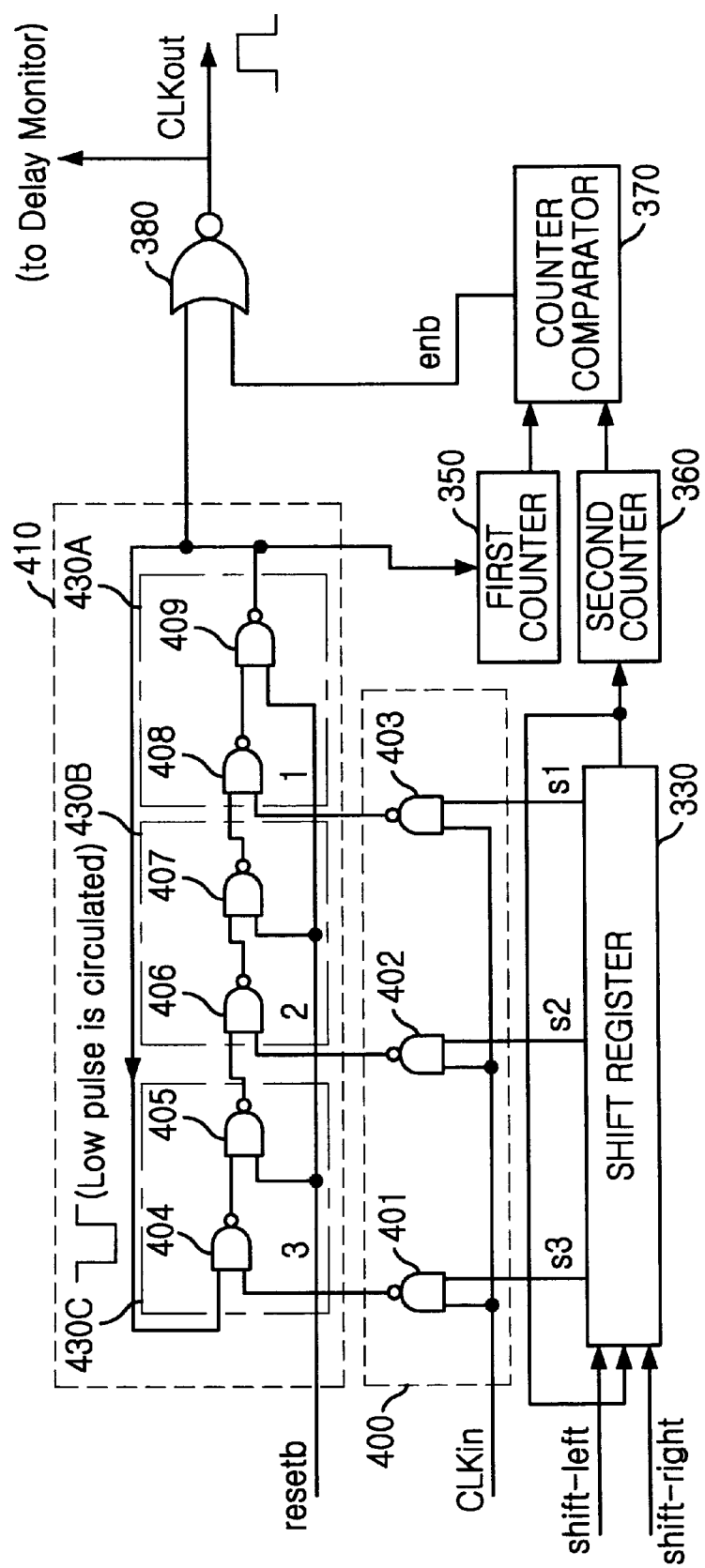
FIG. 4 is a logic level block diagram of portions of the delay locked loop shown in FIG. 3.

FIG. 4 is a logic level block diagram of a portion of the delay locked loop 600 shown in FIG. 3, with the digital delay line 340 detail. The delay locked loop 600 includes a control unit 400 for receiving and selectively outputting the clock input signal CLKin fed thereto from the input unit 300. The output of the control unit 400 is dependent on three shift signals s1, s2, and s3 received from the shift register 330. Mores specifically, as with the conventional DLL shown in FIGS. 1 and 2 above, the control unit 400 will output the CLKin signal to a delay unit of the delay line selected by the shift signals S1, S2, S3.

The delay locked loop 600 also includes a delay block 410 for performing a time delay on the clock input signal CLKin under the control of the control unit 400 and a reset signal resetb. When the resetb signal is set to logic high, the delay block 410 effectively blocks the CLKin signal received from the control unit 400 such that the delay block 410 produces a logic low output regardless of the state of the CLKin signal. The delay block 410 has a loop connected in ring configuration, whereby the output from a NAND gate 409 in the first delay unit 430A is fed as an input into a NAND gate 404 of a third delay unit 430C. The control unit 400 and the delay block 410 form the digital delay line 340.

The first counter 350 serves to count the number of logic high signals outputted from the delay block 410, while the second counter 360 serves to count the number of signals circulated by the shift register 330 via the second ring loop. The counters 350, 360 are preferably conventional counters that can be incremented and/or decremented in steps of one and/or can be reset. The size of the counters 350, 360 (i.e., the highest count number) limit the amount of delay that can be introduced by the delay line as explained further below. Preferably, the counter 360 increments when a logic high signal is circulated clockwise in FIG. 4 and decrements when a logic high signal is circulated counterclockwise in FIG. 4.

The counter comparator 370 compares a counted number stored in the first counter 350 and a counted number stored in the second counter 360 to produce the compared result enb and to output that result (enb) to output unit 380. The output unit 380, exemplary shown as a NOR gate, receives the output data from the delay block 410 (i.e., the output of NAND gate 409), and the compared data from the counter comparator 370 to produce the clock output signal CLKout.

In detail, the control unit 400 includes a first NAND gate 401 with the clock input signal CLKin and the third shift signal s3 as its inputs; a second NAND gate 402 with the clock input signal CLKin and the second shift signal s2 as its inputs; and a third NAND gate 403 with the clock input signal CLKin and the first shift signal s1 as its inputs.

The delay block 410 includes the fourth NAND gate 404 with the output of the first NAND gate 401 and the output of the ninth NAND gate 409 as its inputs; a fifth NAND gate 405 with the output of the fourth NAND gate 404 and the reset signal resetb as its inputs; a sixth NAND gate 406 with the output of the second NAND gate 402 and the output of the fifth NAND gate 405 as its inputs; a seventh NAND gate 407 with the output of the sixth NAND gate 406 and the reset signal resetb as its inputs; an eighth NAND gate 408 with the output of the third NAND gate 403 and the output of the seventh NAND gate 407 as its inputs; and the ninth NAND gate 409 with the output of the eighth NAND gate 408 and the reset signal resetb as its inputs. The NAND gates 408 and 409 form a first unit delay 430A; NAND gates 406 and 407 form a second unit delay 430B; and NAND gates 404 and 405 form a third unit delay 430C.

Figure 5:
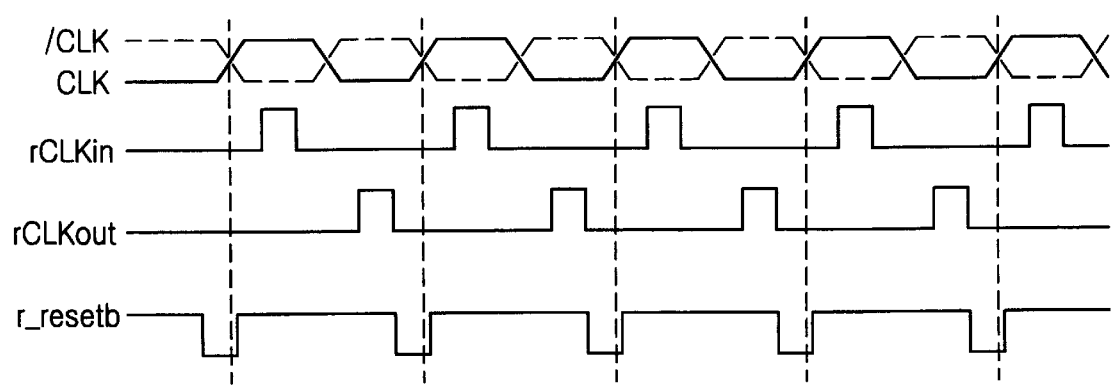
FIG. 5 is an exemplary timing diagram of the reset signal, the input clock signal CLKin and the output clock signal CLKout for the circuit of FIGS. 3 and 4.

The operation of the circuit of FIG. 4 will now be explained. Initially, the first and second counters 350, 360 are reset to zero and the shift register 330 is set to its lowest delay condition (i.e., s3 is low, s2 is low and s1 is high) so that, were the resetb signal to activate the delay line, the CLKin signals would pass through only one delay unit 430A and then resetb resets the delay line for the next CLKin pulse. The ring delay line 340 is repeatedly reset after every CLKout is outputted through output unit 380 (and this ring delay reset should be completed before next CLKin signal comes in) as shown in FIG.5. Otherwise a low pulse once incorporated in the ring delay will circulate the ring forever and will overlap with newly inputted low pulses from consecutive CLKin pulses. If, for example, a time delay corresponding to sixteen delay units is desired, the shift register 330 will be controlled by the phase detector 320 to circulate the logic high bit, one bit shift per a phase comparison, in a clockwise direction five times so that the second counter 360 is incremented to a value of five and the shift signals s3, s2, s1 have the logic condition low, low, high, respectively.

As a result, the CLKin signal is blocked by NAND gates 401 and 402, but passed by NAND gate 403 such that the CLKin signal is input to unit delay 430A. Because the values in the first and second counters 350, 360 are different, the output circuit 380 is disabled when the CLKin signal exits the first unit delay 430A. As a result, the CLKin signal is not output, but instead is circulated back to the third delay unit 430C and the first counter 350 is incremented by one. The CLKin signal will continue to circulate through the delay line 430 until the values in the first and second counters 350, 360 are equal. Because in this example, the second counter is set to five, the CLKin signal must circulate through the delay line 430 five times before the first counter 350 is incremented to five and the output circuit 380 is enabled to produce CLKout. This is equivalent to passing the CLKin signal through sixteen unit delays.

Once the output circuit 380 is activated, the first counter 350 and the ring delay line 410 are preferably reset so that the next CLKin signal experiences the same delay as the previous CLKin signal, unless modifications are required as explained below. Specifically, the delay monitor 310 and the phase detector unit 320 act as described above to produce more or less delay in the CLKout signal by shifting the logic high bit in the shift register 330 left or right as needed (preferably in steps of one). From the foregoing, persons of ordinary skill in the art will appreciate that left shifting the logic high bit from station s3 to station s1 in the shift register 330 increases the number of unit delays by one and right shifting the logic high bit from station s1 to station s3 in the shift register 330 decrements the number of unit delays by one. By setting the second counter 360 to a desired value (for example, by circulating the logic high bit around the shift register 330 a corresponding number of times), one can achieve virtually any desired delay with only a limited number of delay units (in this example 3 delay units 430A, 430B, 430C can produce a delay of an amount much larger than 3 unit delays; which amount is limited only by the highest value that can be stored in the second counter 360 and the bounds of the frequency of the CLKin signal).

Since the first and second counters 350, 360 and the counter comparator 370 have a proportionally smaller area than the eliminated unit delays, the disclosed delay locked loop has the ability to operate even in further low frequency applications with only 30 unit delays.

At an initial state and between the output of the clock output signal CLKout and the input of the clock input signal CLKin, the reset signal resetb is rendered to logic low to thereby initialize the delay block 410.

FIG. 5 is a timing diagram of the reset signal resetb for a rising clock. As is apparent from FIG. 5, at each rising clock, rendering of the reset signal resetb to logic low resets the delay block 410 after the clock output signal CLKout is outputted. This resetting also permits the delay block 410 to be initialized before receiving the clock input signal CLKin.

As mentioned above, the described device employs a ring configuration delay with counters instead of the linear register-controlled DDL used in the prior art, thereby reducing the number of unit delays and the chip area size. Furthermore, operation in low frequency clock application is improved.

Although an exemplary apparatus has been disclosed for illustrative purposes, those skilled in the art will appreciate that the scope of this patent is not limited to the disclosed apparatus. On the contrary, this patent covers all apparatus falling within the scope and spirit of the accompanying claims.

What is claimed is:

1. A delay locked loop for use in a semiconductor memory device, comprising:

an input circuit for receiving an external clock signal and producing a clock input signal;

a delay monitoring circuit for receiving a clock output signal to monitor a time delay of the clock output signal relative to the clock input signal;

a phase detection circuit for receiving the clock input signal of the input circuit and an output signal of the delay monitoring circuit, and for determining a difference in phase between the clock input signal and the output signal of the delay monitoring circuit to produce a shift control signal;

a shift register for controlling the adjustment of the time delay based on the shift control signal from the phase detection circuit, the shift register having a ring configuration in order than an output of the shift register is fed back to its input;

a digital delay line for adjusting the time delay based on an output signal from the shift register, the digital delay line having a ring configuration in order that an output of the digital delay line is fed back to its input;

a first counter for counting an output signal from the digital delay line;

a second counter for counting a number of signals circulated via the ring configuration of the shift register;

a comparing circuit for comparing an output of the first counter and an output of the second counter; and an output circuit for receiving an output signal from the digital delay line and an output signal from the comparing circuit to selectively produce the clock output signal.

2. The delay locked loop as recited in claim 1, wherein the digital delay line comprises:
   a control circuit, which is responsive to the output signal from the shift register, to output the clock input signal received from the input circuit; and
   a delay circuit for introducing a time delay to the clock input signal in response to the control circuit and a reset signal, the delay circuit having the ring configuration of the digital delay line.

3. The delay locked loop as recited in claim 2, wherein the control circuit includes a plurality of logic gates, each of the logic gates receiving the clock input signal and at least a portion of the output signal of the shift register as an input.

4. The delay locked loop as recited in claim 2, wherein the delay circuit comprises:
   a first unit delay stage including: (1) a first logic gate receiving a first output of the control circuit as an input and (2) a second logic gate receiving an output of the first logic gate and the reset signal as inputs, the second logic gate providing an output of the first unit delay stage;
   a second unit delay stage including: (1) a third logic gate receiving the output of the first unit delay stage and a second output of the control circuit as inputs, and (2) a fourth logic gate receiving an output of the third logic gate and the reset signal as inputs, the fourth logic gate producing an output of the second unit delay stage; and
   a third unit delay stage including: (1) a fifth logic gate receiving the output of the second unit delay stage and a third output of the control circuit as inputs, and (2) a sixth logic gate receiving an output of the fifth logic gate and the reset signal as inputs, where an output of the third unit delay stage is an input to the first logic gate.

5. The delay locked loop as recited in claim 2, wherein the output circuit includes a logic gate receiving an output signal of the delay circuit and the output of the comparing circuit as inputs.

6. For use in a semiconductor memory device, a delay locked loop comprising:
   a delay line including a plurality of unit delays and a first loop connecting the last output of the unit delays to an input of an earlier unit delay in the plurality of unit delays;
   a first counter for counting the number of times in which data is transferred via the loop;
   a circuit for determining the desired number of times in which the data is to be transferred via the loop;
   an output circuit for outputting delayed signals from the delay line; and
   a comparator for outputting an output circuit enable signal to activate the output circuit when the number counted by the first counter equals the desired number.

7. A delay locked loop as defined in claim 6 wherein the circuit comprises a second counter.

8. A delay locked loop as defined in claim 7 further comprising a shift register in communication with the delay line for selecting one of the unit delays to receive an input signal to be delayed.

9. A delay locked loop as defined in claim 8 wherein the shift register includes a second loop connecting an output of the shift register to an input of the shift register, and wherein the second counter is responsive to transfer of data via the second loop.

10. A delay locked loop as defined in claim 9 wherein the second counter increments if data is transferred via the second loop in a first direction and the second counter decrements if data is transferred via the second loop in a second direction opposite the first direction.

* * * * *